United States Patent
Tsai et al.

(10) Patent No.: US 9,659,985 B2
(45) Date of Patent: May 23, 2017

(54) INTEGRATED CIRCUIT AND IMAGE SENSING DEVICE HAVING METAL SHIELDING LAYER AND RELATED FABRICATING METHOD

(71) Applicant: TAIWAN SEMICONDUCTOR MANUFACTURING COMPANY LTD., Hsinchu (TW)

(72) Inventors: Tsung-Han Tsai, Miaoli County (TW); Yun-Wei Cheng, Taipei (TW); Chun-Hao Chou, Tainan (TW); Kuo-Cheng Lee, Tainan (TW); Yung-Lung Hsu, Tainan (TW); Hsin-Chi Chen, Tainan (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 14/854,715

(22) Filed: Sep. 15, 2015

(65) Prior Publication Data

US 2016/0240574 A1    Aug. 18, 2016

Related U.S. Application Data

(60) Provisional application No. 62/117,050, filed on Feb. 17, 2015.

(51) Int. Cl.
*H01L 27/146* (2006.01)

(52) U.S. Cl.
CPC .... *H01L 27/14623* (2013.01); *H01L 27/1469* (2013.01); *H01L 27/14634* (2013.01)

(58) Field of Classification Search
USPC ....... 257/219, 225, 239, 240, 241, 435, 246, 257/E27.082–E27.083, E27.15–E27.163, 257/E29.065, E29.227–E29.24, E21.185, 257/E21.189, E21.456–E21.458, E21.617, 257/233, 228, 245, 445–447, 436, 448, 257/449, 451, 453–456, 229; 438/60, 75, 438/144, 48

See application file for complete search history.

(56) References Cited

U.S. PATENT DOCUMENTS

| | | | | |
|---|---|---|---|---|
| 8,378,383 B2* | 2/2013 | Pagaila | ................ | H01L 21/568 257/125 |
| 2010/0252934 A1* | 10/2010 | Law | ..................... | H01L 23/481 257/774 |

* cited by examiner

*Primary Examiner* — Dao H Nguyen
*Assistant Examiner* — Tram H Nguyen
(74) *Attorney, Agent, or Firm* — WPAT, P.C., Intellectual Property Attorneys; Anthony King

(57) ABSTRACT

An integrated circuit includes a first semiconductor device, a second semiconductor device, and a metal shielding layer. The first semiconductor device includes a first substrate and a first multi-layer structure, and the first substrate supports the first multi-layer structure. The second semiconductor device includes a second substrate and a second multi-layer structure, and the second substrate supports the second multi-layer structure. The metal shielding layer is disposed between the first multi-layer structure and the second multi-layer structure, wherein the metal shielding layer is electrically connected to the second semiconductor device.

18 Claims, 14 Drawing Sheets

INTEGRATED CIRCUIT AND IMAGE SENSING DEVICE HAVING METAL SHIELDING LAYER AND RELATED FABRICATING METHOD

PRIORITY CLAIM AND CROSS-REFERENCE

This application claims the benefit of provisional application Ser. 62/117,050 filed on Feb. 17, 2015, entitled "INTEGRATED CIRCUIT AND IMAGE SENSING DEVICE HAVING METAL SHIELDING LAYER AND RELATED FABRICATING METHOD", the disclosure of which is hereby incorporated by reference in its entirety.

BACKGROUND

Complementary metal-oxide-semiconductor (CMOS) image sensors (CIS) are commonly used for sensing images in electronic video and still cameras. For a three-dimensional (3D) CMOS image sensor comprising two stacked wafers, the first wafer may be configured to sense incident light, and the second wafer may be configured to process the electronic signal generated by the first wafer. One challenge of the 3D CMOS image sensor is how to dissipate heat generated within the image sensor because excessive heat may adversely affect the image sensor. For example, malfunction of the image sensor occurs when the operating temperature goes beyond a critical threshold temperature. Another challenge is how to release/discharge the static charge accumulated within or on light shielding metal in the image sensor. The accumulated static charge may cause an electrostatic discharge (ESD), which can damage an integrated circuit (IC) device in the image sensor.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Figure 1:
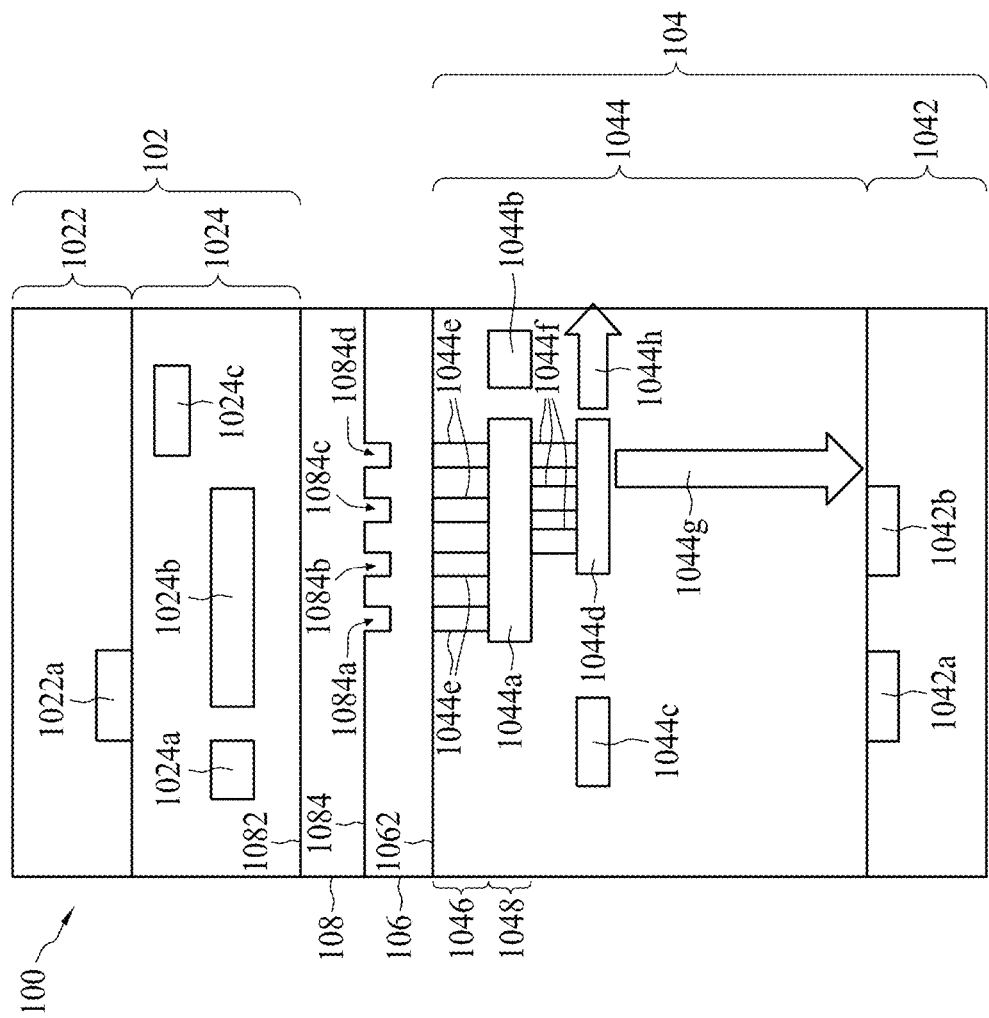
FIG. 1 is a cross-sectional view of an integrated circuit in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

In the present disclosure, a three-dimensional (3D) integrated circuit is discussed. The 3D integrated circuit may include a 3D complementary metal-oxide-semiconductor (CMOS) image sensor (CIS). However, the present concept may also apply to other 3D integrated circuits or 3D semiconductor devices when the similar effect is expected.

FIG. 1 is a cross-sectional view of an integrated circuit 100 in accordance with some embodiments. The integrated circuit 100 shows a partial semiconductor configuration of a light sensing device. In an embodiment, the light sensing device serves as a 3D CMOS image sensor. The 3D CMOS image sensor comprises two wafers bonded to each other. The bonded wafers include a first wafer (e.g. the upper wafer) configured to sense incident light, and a second wafer (e.g. the lower wafer) configured to process the electronic signal generated by the first wafer.

Referring to FIG. 1, the integrated circuit 100 comprises a first semiconductor device 102, a second semiconductor device 104, a metal shielding layer 106, and an oxide layer 108. For illustration, the first semiconductor device 102 is shown in a partial cross-section of the upper wafer and the second semiconductor device 104 is shown in a partial cross-section of the lower wafer.

The first semiconductor device 102 comprises a first substrate 1022 and a first multi-layer structure 1024 formed over the first substrate 1022. In an embodiment, the first substrate 1022 includes a silicon substrate configured to support the first multi-layer structure 1024. Moreover, the first substrate 1022 may include an application specific integrated circuit (ASIC) (not shown) formed therein. The ASIC may include various circuit components (e.g. photodiodes) arranged to convert the incident light into an electronic signal. It should be appreciated that other components or devices may also be included or incorporated in the first substrate 1022. For brevity, only a doping well region 1022a is illustrated in the first substrate 1022, and the detailed configuration of the first substrate 1022 is omitted in FIG. 1. The well region 1022 may represent a photodiode in the first substrate 1022.

The first multi-layer structure 1024 includes a stacked structure defined by a plurality of metal layers insulated by a plurality of dielectric layers, i.e. the so-called interlayer dielectric (ILD). Metal lines are formed in the plurality of metal layers, and other components, such as conductive vias and/or contacts, may be formed in the plurality of dielectric layers in order to electrically connect the metal lines in different metal layers. The first multi-layer structure 1024 may be configured as the back end of line so as to transmit the electronic signal of the first substrate 1022. In this embodiment, only a plurality of metal films 1024a, 1024b, and 1024c are shown in FIG. 1, and other components are omitted for the sake of brevity. The metal films 1024a and 1024b may be formed in the top metal layer, i.e. the furthest metal layer from the first substrate 1022, of the plurality of metal layers, and the metal film 1024c may be formed in the other metal layer closer to the first substrate 1022.

The second semiconductor device 104 comprises a second substrate 1042 and a second multi-layer structure 1044 formed over the second substrate 1042. In an embodiment, the second substrate 1042 includes a silicon substrate configured to support the second multi-layer structure 1044. Furthermore, the second substrate 1042 may include an application specific integrated circuit (ASIC). The ASIC may include a CMOS logic circuit arranged to process the electronic signal generated from the first semiconductor device 102. In addition, a through oxide via (TOV) may be formed to electrically connect the first semiconductor device 102 and the second semiconductor device 104. The TOV is arranged to transmit signals between the first semiconductor device 102 and the second semiconductor device 104. In this embodiment, only two doping well regions 1042a, 1042b are shown in FIG. 1, and other components are omitted for the sake of brevity. The well regions 1042a, 1042b may represent a CMOS transistor in the second substrate 1042. It should be appreciated that other components or devices may also be included or incorporated in the second substrate 1042.

The oxide layer 108 and the metal shielding layer 106 are disposed between the first semiconductor device 102 and the second semiconductor device 104. Specifically, the oxide layer 108 has a first surface 1082 in contact with the first multi-layer structure 1024 of the first semiconductor device 102. Moreover, the metal shielding layer 106 has a first surface 1062 in contact with the second multi-layer structure 1044 of the second semiconductor device 102. Furthermore, a second surface 1084 of the oxide layer 108 is in contact with the second surface of the metal shielding layer 106. A plurality of uneven portions 1084a, 1084b, 1084c, and 1084d are formed on the second surface 1084, and the reason will be discussed in the later paragraphs. As such, the metal shielding layer 106 is configured to electrically connect the second multi-layer structure 1044 of the second semiconductor device 104. Nevertheless, the metal shielding layer 106 is configured to electrically disconnect from the TOV.

In some embodiments, the second multi-layer structure 1044 includes a stacked structure defined by a plurality of metal layers insulated by a plurality of dielectric layers, i.e. the interlayer dielectric. Similar to the first multi-layer structure 1024, the metal lines are formed in the plurality of metal layers, and other components, such as conductive vias and/or contacts, may be formed in the plurality of dielectric layers in order to electrically connect the metal lines in different metal layers. The second multi-layer structure 1044 may be configured as the back end of line so as to transmit the electronic signal of the second substrate 1042. In this embodiment, a plurality of metal films 1044a, 1044b, 1044c, 1044d, at least one first conductive via 1044e, and at least one second conductive via 1044f are shown in FIG. 1, and other components are omitted for the sake of brevity. The metal films 1044a and 1044b may be formed in the top metal layer, i.e. the furthest metal layer from the second substrate 1042, of the plurality of metal layers, and the metal films 1044c and 1044d may be formed in the next metal layer closer to the second substrate 1042. Furthermore, the first conductive via 1044e may comprise a plurality of conductive vias as shown in FIG. 1. However, for brevity, the first conductive via 1044e is described as a single conductive via in the following paragraphs. Similarly, the second conductive via 1044f may also comprise a plurality of conductive vias as shown in FIG. 1.

The first conductive via 1044e is formed in the dielectric layer between the top metal layer of the second multi-layer structure 1044 and the metal shielding layer 106 in order to electrically connect the metal shielding layer 106 to the metal films 1044a and 1044b. The second conductive via 1044f is formed in the dielectric layer between the top metal layer of the second multi-layer structure 1044 and the next metal layer in order to electrically connect the metal film 1044a to the metal film 1044d. Specifically, the first conductive via 1044e is disposed in a first layer (i.e. 1046) adjacent to the metal shielding layer 106, and the metal film 1044a is disposed in a second layer (i.e. 1048) adjacent to the first layer (i.e. 1046) as shown in FIG. 1.

More specifically, the first conductive via 1044e has a first end (not numbered) electrically connected to the first surface 1062 of the metal shielding layer 106 and a second end (not numbered) electrically connected to the first metal film 1044a. Moreover, the second conductive via 1044f has a first end (not numbered) electrically connected to the first metal film 1044a and a second end (not numbered) electrically connected to the metal film 1044d. As a result, in this embodiment, the first conductive via 1044e is formed in the dielectric layer 1046 between the first metal film 1044a and the metal shielding layer 106 in order to electrically connect the metal shielding layer 106 to the second multi-layer structure 1044. In some existing approaches, however, such metal shielding layer is electrically disconnected from any of the metal films of a second multi-layer structure. Consequently, in the existing approaches there is no conductive via formed in a dielectric layer like the dielectric layer 1046.

In some embodiments, the metal shielding layer 106 includes a metal layer and functions to block or at least reduce light passing from the first semiconductor device 102 to the second semiconductor device 104 because the penetrating light may adversely affect the normal operation of the ASIC on the second substrate 1042. In a 3D CMOS image sensor, the temperature of the metal shielding layer 106 may increase or static charge may accumulate on the metal shielding layer 106 during operation of the 3D CMOS image sensor. In the embodiments according to the present disclosure, by electrically connecting the metal shielding layer 106 to the metal film in the second multi-layer structure 1044, heat generated in the metal shielding layer 106 can be dissipated and/or the static charge on the metal shielding layer 106 can be released. Accordingly, the thermal dissipation problem and the electrostatic discharge (ESD) problem of the metal shielding layer 106 are solved. By comparison, in the existing approaches, the metal shielding layer is isolated from the metal films of the upper wafer and/or the lower wafer.

It is noted that the integrated circuit 100 in FIG. 1 is shown in a simplified cross-sectional view. Persons having ordinary skill in the art can understand that the metal shielding layer 106 is not limited to being connected to the metal film 1044a and the metal film 1044d through the first conductive via 1044e and the second conductive via 1044f. The metal film 1044a may be conducted to any part of the 3D CMOS image sensor, such as the second substrate 1042 and/or an input/output (I/O) port (not shown) of the 3D CMOS image sensor, as long as the heat and/or the static charge on the metal shielding layer 106 can be dissipated/released. The arrow 1044g indicates that the metal shielding layer 106 may be electrically connected to the second substrate 1042. The arrow 1044h indicates that the metal shielding layer 106 may be electrically connected to the I/O port of the 3D CMOS image sensor.

Moreover, even though the metal shielding layer 106 is electrically connected to the top metal film 1044a through the second conductive via 1044f in FIG. 1, this is not a limitation of the present invention. The metal shielding layer 106 may be electrically connected to any metal film in the metal layers through the conductive via(s). For example, the metal shielding layer 106 may be directly/indirectly electrically connected to a metal film in the second metal layer through a conductive via. The metal shielding layer 106 may also be directly/indirectly electrically connected to the second substrate 1042 through a contact. Any combinations of the above wiring structures shall also fall within the contemplated scope of the claimed invention.

Figure 2:
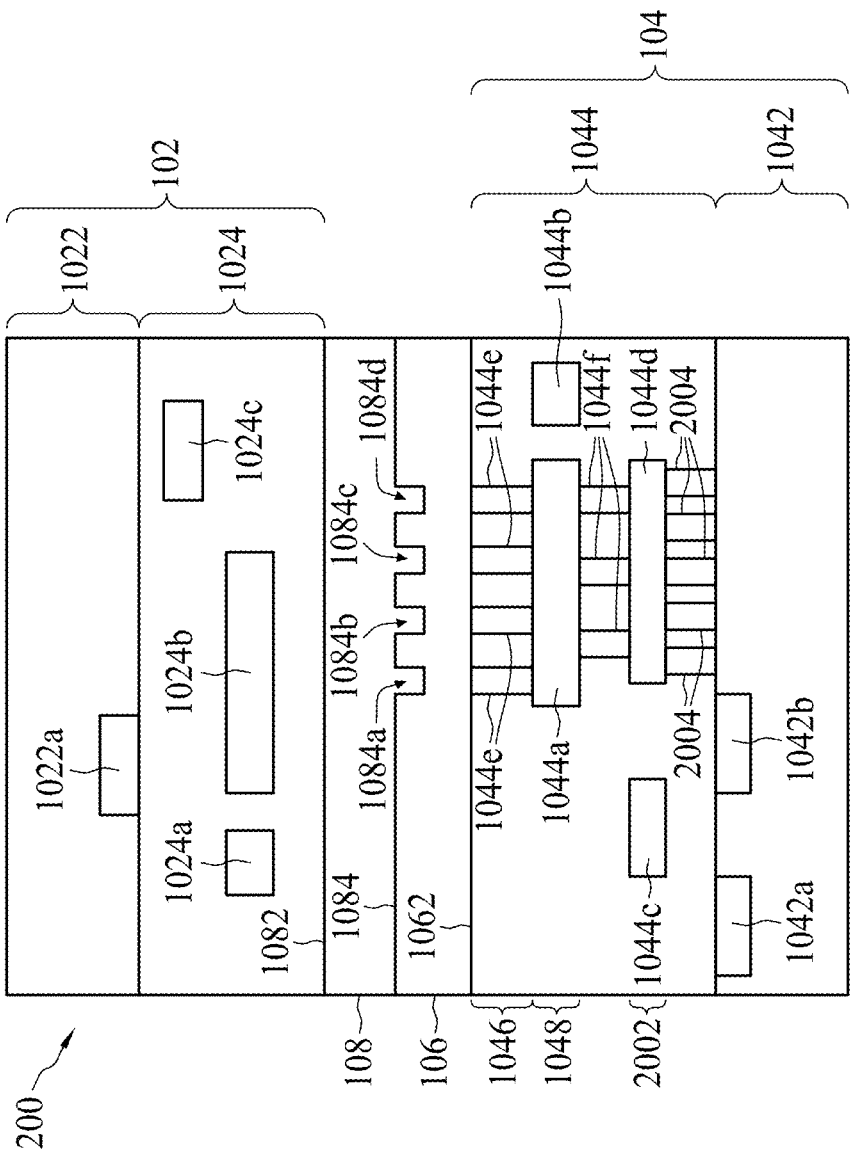
FIG. 2 is a cross-sectional view of an integrated circuit in accordance with some embodiments.

FIG. 2 is a cross-sectional view of an integrated circuit 200 in accordance with some embodiments. Referring to FIG. 2, the integrated circuit 200 exhibits a partial semiconductor configuration of a 3D CMOS image sensor. For brevity, the second multi-layer structure 1044 comprises two metal layers, i.e. the top metal layer 1048 and the lowest metal layer 2002. However, this is not a limitation of the present invention. In this exemplary embodiment, the metal shielding layer 106 is configured to electrically connect the second substrate 1042.

Specifically, the integrated circuit 200 comprises a plurality of conductive vias 2004 connecting the metal film 1044d and the second substrate 1042. The plurality of conductive vias 2004 are configured to electrically connect the metal film 1044d to the second substrate 1042 in order to dissipate heat from the metal shielding layer 106 and to release static charge in the metal shielding layer 106 to the second substrate 1042. The second substrate 1042 may be configured as an application specific integrated circuit. It is noted that the components in FIG. 2 having the similar reference numerals with the components in FIG. 1 also have the similar characteristics, and thus the detailed description is omitted here for brevity.

Figure 3:
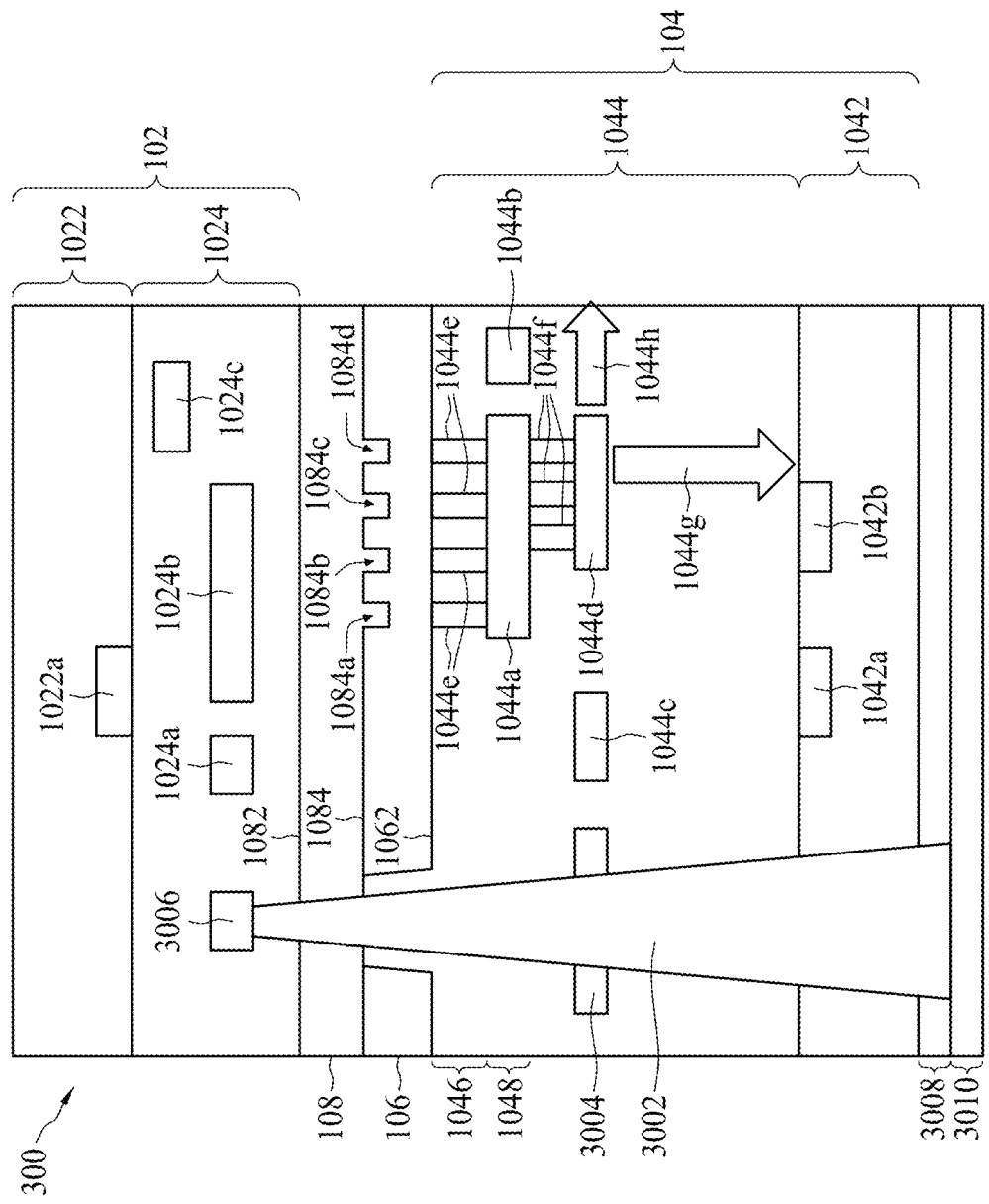
FIG. 3 is a cross-sectional view of an integrated circuit in accordance with some embodiments.

FIG. 3 is a cross-sectional view of an integrated circuit 300 in accordance with some embodiments. Referring to FIG. 3, the integrated circuit 300 exhibits a partial semiconductor configuration of a 3D CMOS image sensor. In comparison to the integrated circuit 100 described and illustrated with reference to FIG. 1, the integrated circuit 300 further comprises a TOV 3002, metal films 3004, 3006, a bottom anti-reflective coating layer (BARC) 3008, and a passivation layer 3010. The TOV 3002 is configured to electrically connect to the metal film 3006 in the first multi-layer structure 1024 and/or the metal film 3004 in the second multi-layer structure 1044. The metal film 3006 can be the metal film in any metal layers in the first multi-layer structure 1024. The metal film 3004 can also be the metal film in any metal layers in the second multi-layer structure 1044. The TOV 3002 may be configured to conduct a reference voltage (e.g. supply power or ground voltage) to the circuits in the first semiconductor device 102 and the second semiconductor device 104. Therefore, the metal film 3006 in the first multi-layer structure 1024 may further electrically connect the first substrate 1022, and the metal film 3004 may further electrically connect the second substrate 1042. Moreover, the TOV 3002 may also be configured to conduct signals between the first semiconductor device 102 and the second semiconductor device 104. The detailed structure is omitted here for brevity.

In addition, the BARC 3008 is formed over the second substrate 1042. The BARC 3008 is configured to have an opening for the TOV 3002. In this exemplary embodiment, the passivation layer 3010 is formed over the BARC 3008. The material of the passivation layer 3010 may include silicon nitride. It should be noted that the TOV 3002 may be configured to connect to an external I/O port for receiving or outputting a signal. However, the detailed structure is omitted here for brevity.

According to the exemplary embodiment of FIG. 3, the TOV 3002 is configured to electrically disconnect the metal shielding layer 106. The metal film 3004 is configured to electrically disconnect the first conductive via 1044e, the metal film 1044a, and the metal film 1044d. Therefore, the present first conductive via 1044e does not affect the normal operation of the TOV 3002.

Figure 4:
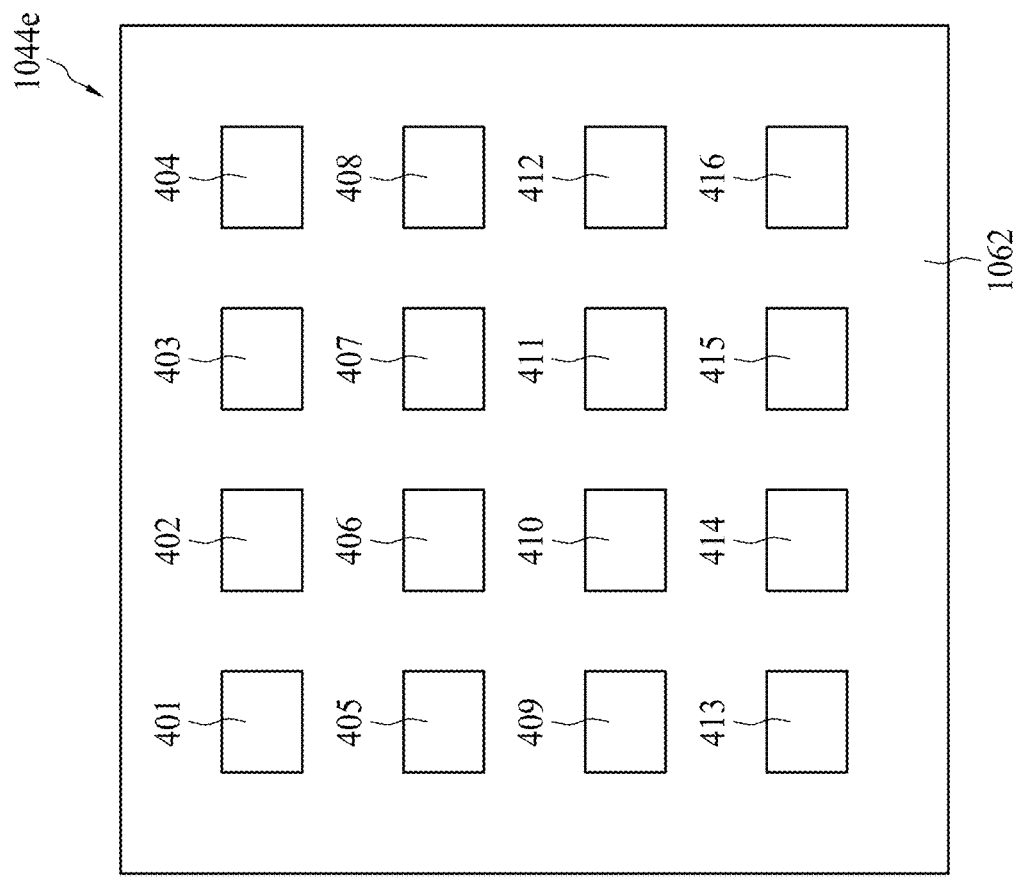
FIG. 4 is a top-view diagram illustrating a first conductive via comprising a plurality of conductive vias in accordance with some embodiments.

Moreover, when the first conductive via 1044e is implemented as a plurality of conductive vias, the present disclosure is not limited to the shape of each via and the arrangement of the plurality of conductive vias. Each conductive via may be configured to have a substantially circular or oval cross section. FIG. 4 is a top-view diagram illustrating the first conductive via 1044e comprising a plurality of conductive vias 401-416 in accordance with some embodiments. Referring to FIG. 4, each of the conductive vias 401-416 is configured to have a substantially square cross section. The conductive vias 401-416 are electrically connected to the first surface 1062 of the metal shielding layer 106.

Figure 5:
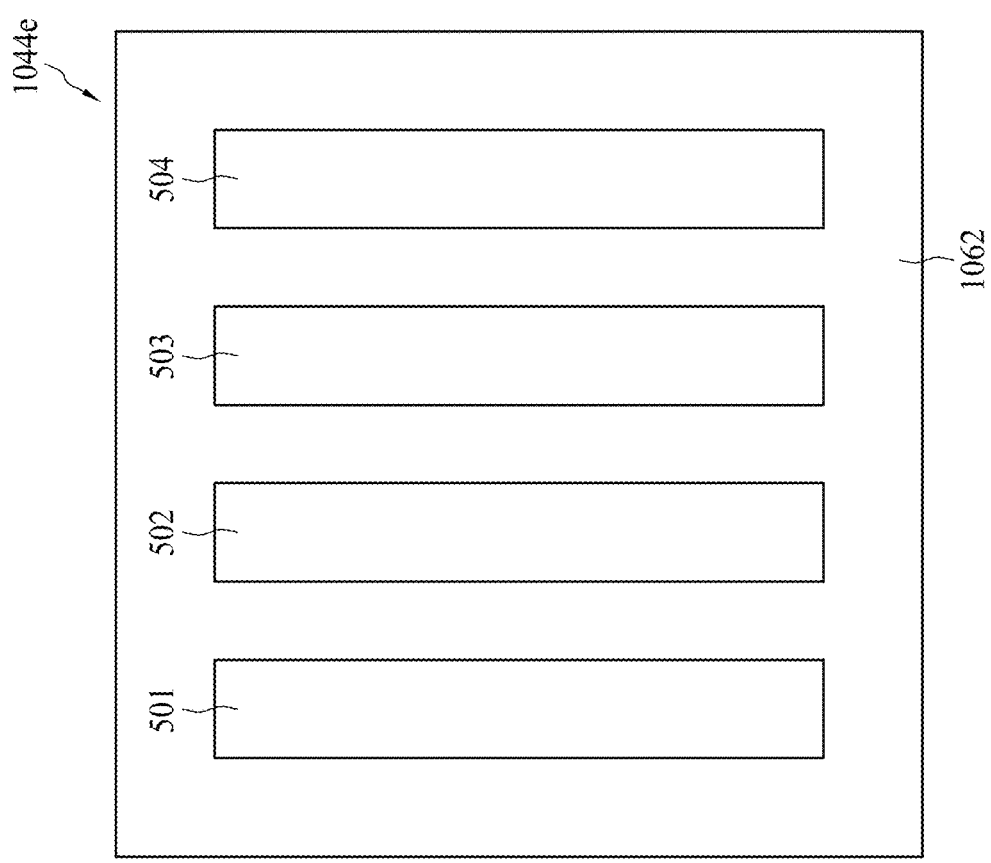
FIG. 5 is a top-view diagram illustrating a first conductive via comprising a plurality of conductive vias in accordance with some embodiments.

FIG. 5 is a top-view diagram illustrating the first conductive via 1044e comprising a plurality of conductive vias 501-504 in accordance with some embodiments. Referring to FIG. 5, each of the conductive vias 501-504 is configured to have a substantially rectangular cross section. The conductive vias 501-504 are electrically connected to the first surface 1062 of the metal shielding layer 106. Therefore, the first conductive via 1044e may be configured to be any appropriate number of polygonal/circular/ellipsoidal via(s) in order to electrically connect the first surface 1062 of the metal shielding layer 106.

It is noted that the first conductive via 1044e may cause uneven surfaces in the metal shielding layer 106 during the semiconductor fabricating process. Referring to FIG. 1 again, the portions 1084a, 1084b, 1084c, and 1084d, which correspond to the locations of the plurality of conductive vias (i.e. 1044e), of the second surface 1084 of the metal shielding layer 106 are slightly deformed such that the oxide in the oxide layer 108 may fill in the uneven notches.

Figure 6:
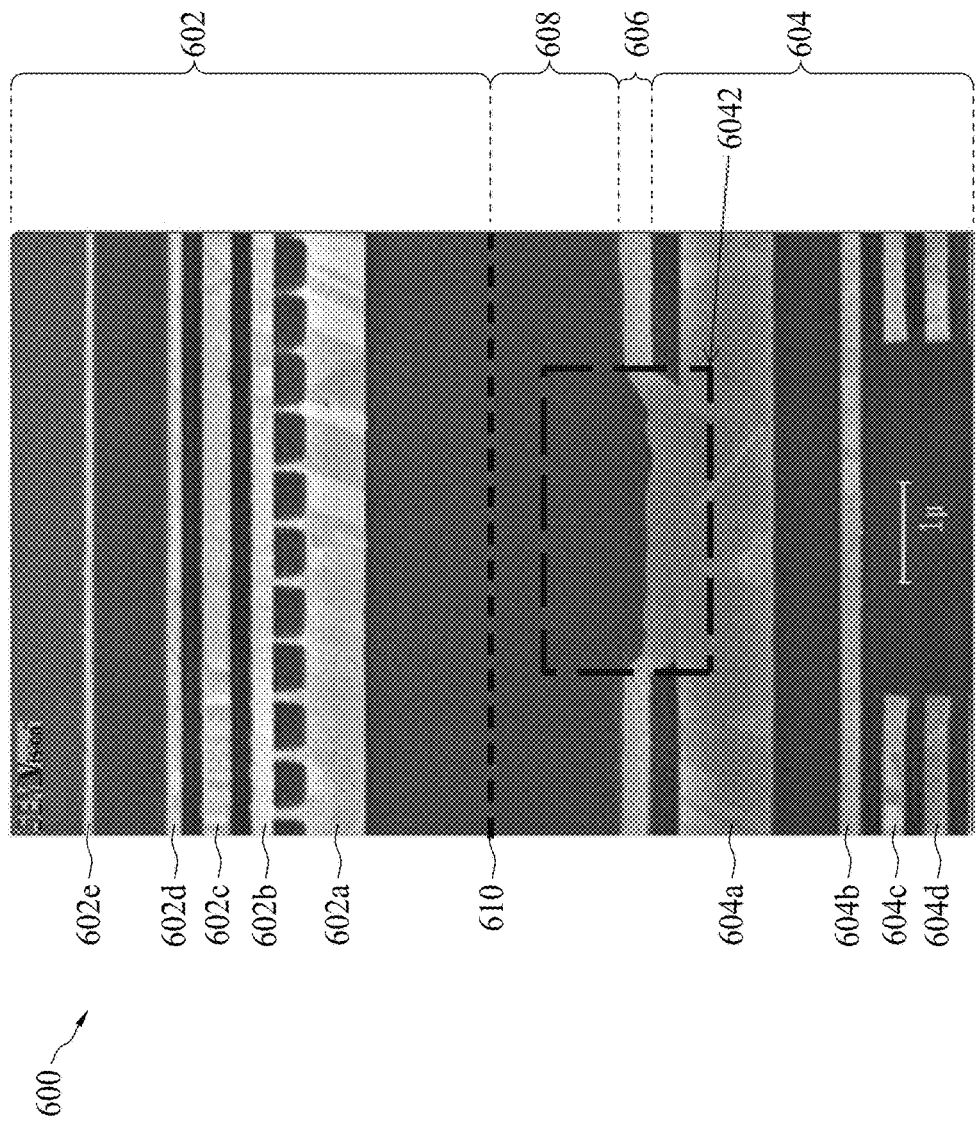
FIG. 6 is a real picture showing a cross-sectional view of a partial semiconductor configuration of a 3D CMOS image sensor in accordance with some embodiments.

FIG. 6 is a real picture illustrating a cross-sectional view of a partial semiconductor configuration 600 of a 3D CMOS image sensor in accordance with some embodiments. Referring to FIG. 6, the partial semiconductor configuration 600 comprises a first multi-layer structure 602, a second multi-layer structure 604, a metal shielding layer 606, and an oxide layer 608. The first substrate adjoining the first multi-layer structure 602 and the second substrate adjoining the second multi-layer structure 604 are omitted for brevity. A dotted line 610 crossing the oxide layer 608 represents the bonding interface of the upper semiconductor structure and the lower semiconductor structure. For brevity, the TOV is not shown in FIG. 6.

The first multi-layer structure 602 comprises five metal layers 602a, 602b, 602c, 602d, and 602e. The metal layer 602a is the top metal layer and is the thickest metal layer among the metal layers 602a, 602b, 602c, 602d, and 602e. A plurality of conductive vias are formed between the metal layers 602a and 602b. The metal layers 602a, 602b, 602c, 602d, and 602e are insulated by interlayer dielectrics.

In addition, the second multi-layer structure 604 comprises four metal layers 604a, 602b, 602c, and 602d. The metal layer 604a is the top metal layer and is the thickest metal layer among the metal layers 604a, 604b, 604c, and 604d. The metal layers 604a, 604b, 604c, and 604d are insulated by interlayer dielectrics.

The conductive via 6042 is formed in the dielectric layer between the metal shielding layer 606 and the top metal layer 604a. As described above, the metal shielding layer 606 may be caused to slightly deform due to the formation of the conductive via 6042.

In some embodiments, the top metal layer 604a is thicker than the metal shielding layer 606. For example, the thickness of the metal shielding layer 606 is approximately 1.5 kÅ (Ångström), and the thickness of the top metal layer 604a is 10 times thicker than the metal shielding layer 606.

The present invention is not limited to a specific semiconducting process for forming the conductive via 6042. In some embodiments, the conductive via 6042 may be formed by the process of physical vapor deposition (PVD).

Figure 7:
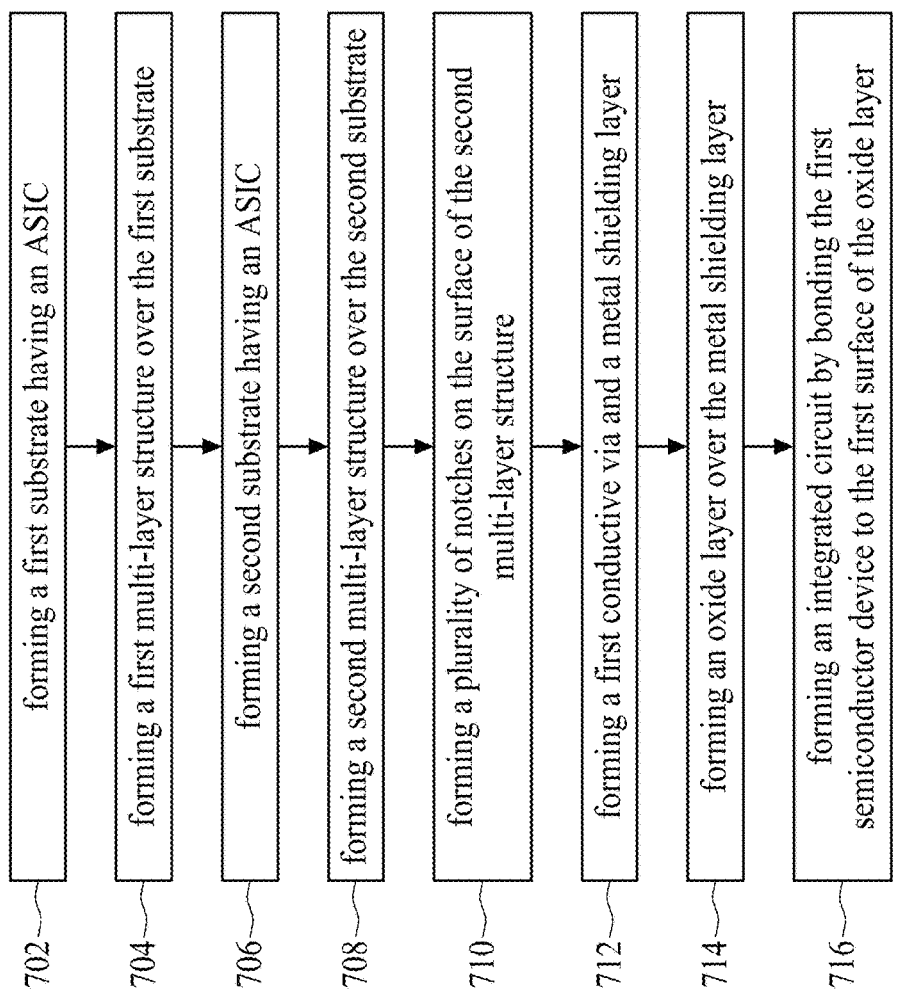
FIG. 7 is a flow diagram of a method of fabricating an integrated circuit in accordance with some embodiments.
Figure 8:
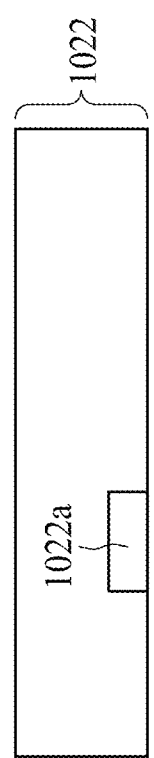
FIG. 8 is a cross-sectional view of a first substrate formed during a fabricating process in accordance with some embodiments.
Figure 9:
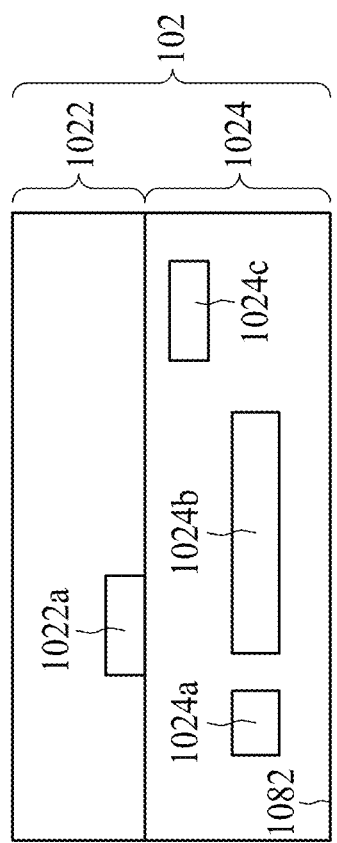
FIG. 9 is a cross-sectional view of a first multi-layer structure formed during a fabricating process in accordance with some embodiments.
Figure 10:
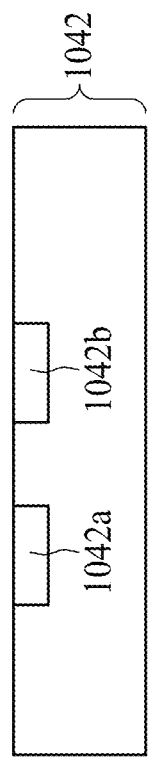
FIG. 10 is a cross-sectional view of a second substrate formed during a fabricating process in accordance with some embodiments.
Figure 11:
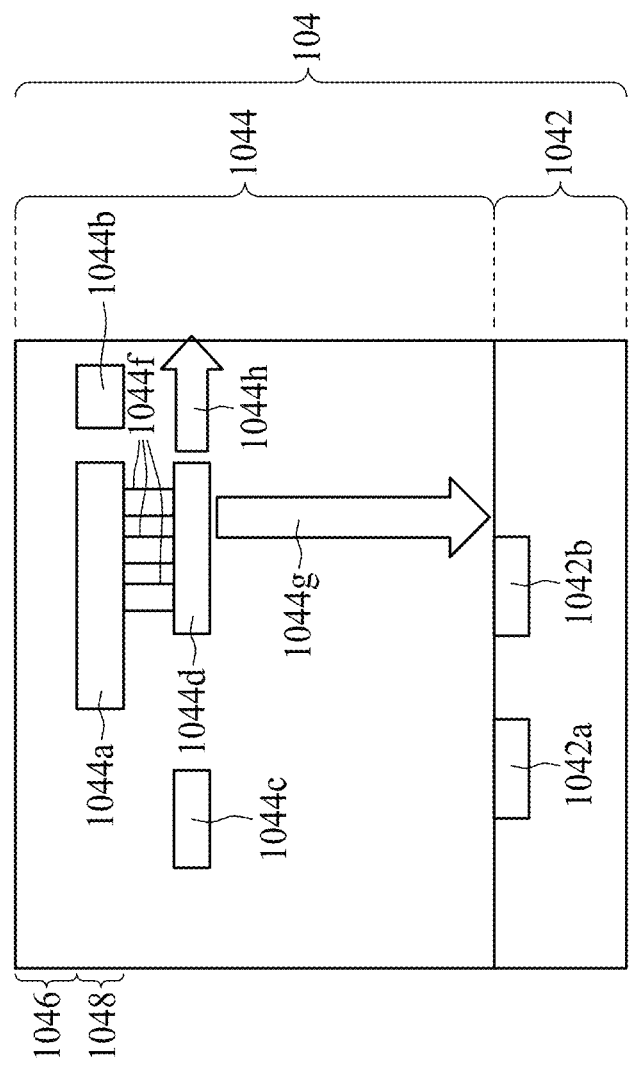
FIG. 11 is a cross-sectional view of a second multi-layer structure formed during a fabricating process in accordance with some embodiments.
Figure 12:
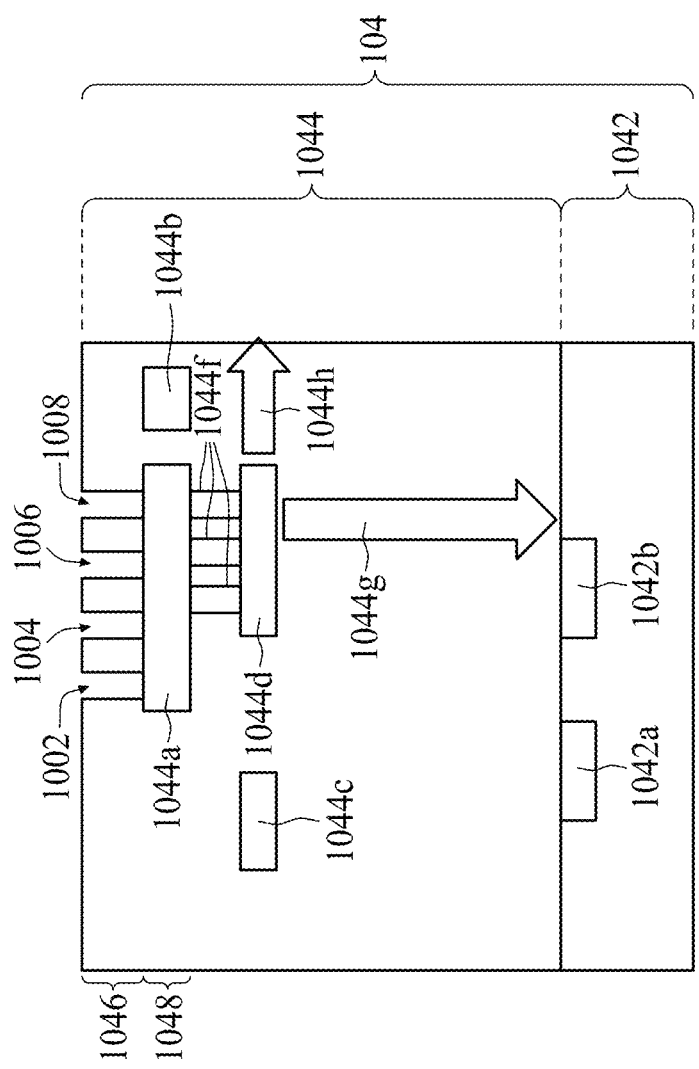
FIG. 12 is a cross-sectional view of a second multi-layer structure, having a plurality of notches, formed during a fabricating process in accordance with some embodiments.
Figure 13:
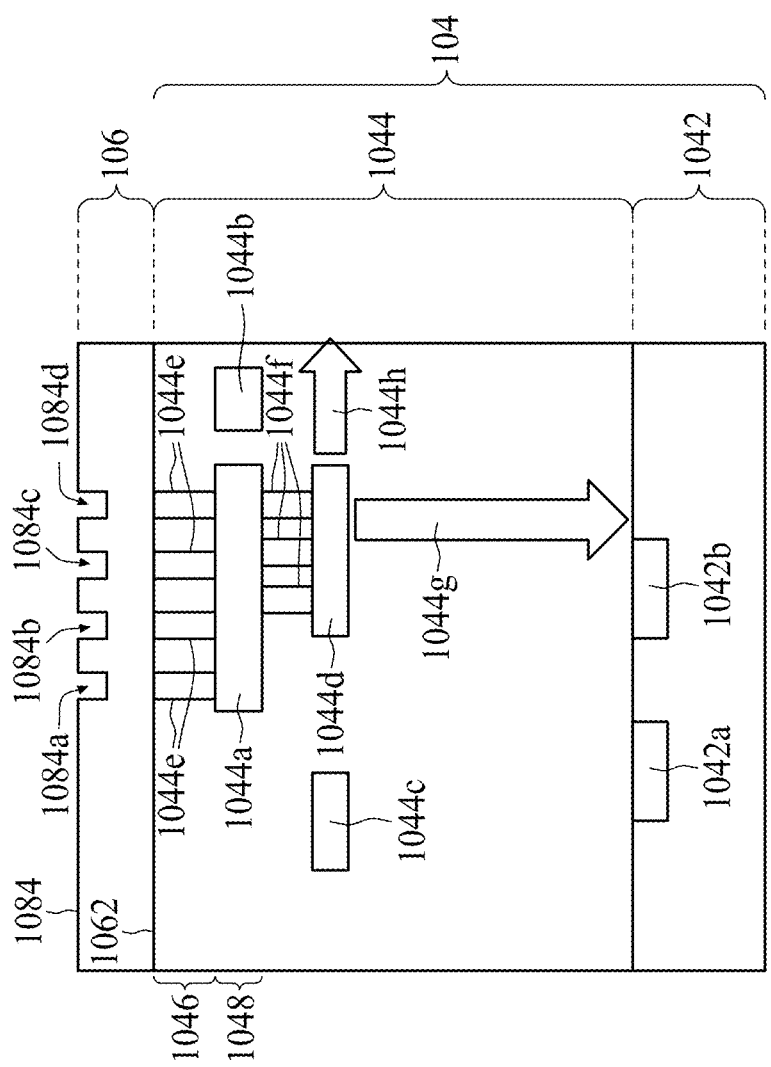
FIG. 13 is a cross-sectional view of a first conductive via and a metal shielding layer formed during a fabricating process in accordance with some embodiments.
Figure 14:
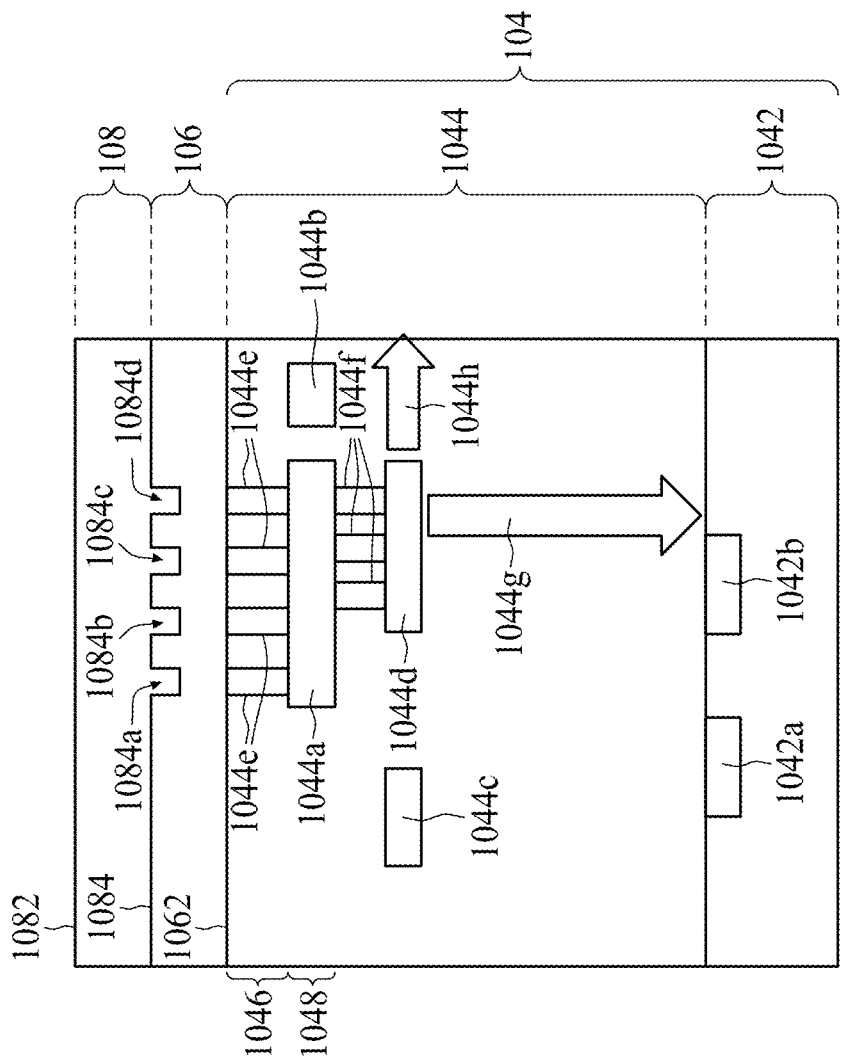
FIG. 14 is a cross-sectional view of an oxide layer formed during a fabricating process in accordance with some embodiments.

FIG. 7 is a flow diagram illustrating a method 700 of fabricating the integrated circuit 100 in accordance with some embodiments. FIGS. 8-14 are diagrams illustrating stages in the fabrication of the integrated circuit 100 in accordance with some embodiments. Specifically, FIG. 8 is a cross-sectional view of the first substrate 1022 formed during a fabricating process in accordance with some embodiments. FIG. 9 is a cross-sectional view of the first multi-layer structure 1024 formed during the fabricating process in accordance with some embodiments. FIG. 10 is a cross-sectional view of the second substrate 1042 formed during the fabricating process in accordance with some embodiments. FIG. 11 is a cross-sectional view of the second multi-layer structure 1044 formed during the fabricating process in accordance with some embodiments. FIG. 12 is a cross-sectional view of the second multi-layer structure 1044, having a plurality of notches 1002, 1004, 1006 and 1008, formed during the fabricating process in accordance with some embodiments. FIG. 13 is a cross-sectional view of the first conductive via 1044e and the metal shielding layer 106 formed during the fabricating process in accordance with some embodiments. FIG. 14 is a cross-sectional view of the oxide layer 108 formed during the fabricating process in accordance with some embodiments. The method is a simplified semiconductor process. Therefore, other steps or operations may be incorporated in the process.

Referring to FIG. 7 and also to FIG. 8, in operation 702, the first substrate 1022 having an ASIC is formed. The first substrate 1022 may be formed on a handling wafer (not shown) that facilitates the fabrication of first substrate 1022.

Referring to FIG. 9, in operation 704, the first multi-layer structure 1024 comprising the plurality of metal films 1024a, 1024b, and 1024c is formed over the first substrate 1022 in order to form the first semiconductor device 102. The first multi-layer structure 1024 is the back end of line of the first substrate 1022.

Referring to FIG. 10, in operation 706, the second substrate 1042 having an ASIC is formed. The second substrate 1042 may be formed on a handle wafer (not shown) that facilitates the fabrication of the second substrate 1042. The handle wafer may be a silicon-on-insulator (SOI) handle wafer. Therefore, the second substrate 1042 may at least comprise an insulator layer in which the ASIC is formed thereon.

Referring to FIG. 11, in operation 708, the second multi-layer structure 1044 comprising the plurality of metal films 1044a, 1044b, 1044c, 1044d, and the second conductive via 1044f is formed over the second substrate 1042. The second multi-layer structure 1044 is the back end of line of the second substrate 1042.

Referring to FIG. 12, in operation 710, a plurality of notches 1002, 1004, 1006, and 1008 are formed on the surface of the second multi-layer structure 1044. The plurality of notches 1002, 1004, 1006, and 1008 are deep enough to expose the top metal films 1044a. The plurality of notches 1002, 1004, 1006, and 1008 may be formed by a semiconductor etching process.

Referring to FIG. 13, in operation 712, the first conductive via 1044e and the metal shielding layer 106 are formed by the process of PVD. Specifically, when the first conductive via 1044e and the metal shielding layer 106 are formed by a single PVD process, particles may evenly deposit on the plurality of notches and on the other surface of the second multi-layer structure 1044 such that the uneven surfaces are formed in the metal shielding layer 106 as shown in FIG. 1 and FIG. 6. However, in some embodiments, the first conductive via 1044e and the metal shielding layer 106 may also be formed by different PVD stages in order to planarize the uneven surfaces of the metal shielding layer 106.

Referring to FIG. 14, in operation 714, the oxide layer 108 is formed over the metal shielding layer 106.

Referring back to FIG. 1, in operation 716, the first semiconductor device 102 is flipped to bond with the first surface 1082 of the oxide layer 108 in order to form the integrated circuit 100.

It is noted that the method may further comprise the operation of forming a TOV, which is electrically disconnected from the metal shielding layer 106, between the first semiconductor device 102 and the second semiconductor device 104 so as to electrically connect the first semiconductor device 102 and the second semiconductor device 104. The operation of forming the TOV may be performed by a semiconductor etching process and a semiconductor deposition process after the operation 716. The operation of forming the TOV is omitted in FIG. 7 for brevity.

Accordingly, the first conductive via 1044e is formed to electrically connect the metal shielding layer 106. By electrically connecting the metal shielding layer 106 to the metal film in the second multi-layer structure 1044, heat from the metal shielding layer 106 can be dissipated and/or static charge accumulated in the metal shielding layer 106 can be released. Thus, the thermal dissipation problem and the electrostatic discharge (ESD) problem of the metal shielding layer 106 are solved.

In some embodiments, an integrated circuit includes a first semiconductor device, a second semiconductor device, and a metal shielding layer. The first semiconductor device includes a first substrate and a first multi-layer structure, and the first substrate supports the first multi-layer structure. The second semiconductor device includes a second substrate and a second multi-layer structure, and the second substrate supports the second multi-layer structure. The metal shielding layer is disposed between the first multi-layer structure and the second multi-layer structure, wherein the metal shielding layer is electrically connected to the second semiconductor device.

In some embodiments, a method of fabricating an integrated circuit includes: forming a first substrate; forming a first multi-layer structure over the first substrate so as to form a first semiconductor device; forming a second substrate; forming a second multi-layer structure over the second substrate so as to form a second semiconductor device; forming a metal shielding layer between the first multi-layer structure and the second multi-layer structure; and electrically connecting the metal shielding layer to the second semiconductor device.

In some embodiments, a light sensing device includes a first semiconductor device, a second semiconductor device, and a metal shielding layer. The first semiconductor device includes a first substrate and a first multi-layer structure. The first substrate supports the first multi-layer structure, and the first semiconductor converts an inputting light into an electronic signal. The second semiconductor device comprises a second substrate and a second multi-layer structure. The second substrate supports the second multi-layer structure, and the second semiconductor device receives the electronic signal. The metal shielding layer is disposed between the first multi-layer structure and the second multi-layer structure, wherein the metal shielding layer is electrically connected to the second semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
  a first semiconductor device, comprising a first substrate and a first multi-layer structure, the first substrate supporting the first multi-layer structure;
  a second semiconductor device, comprising a second substrate and a second multi-layer structure, the second substrate supporting the second multi-layer structure; and
  a metal shielding layer, disposed between the first multi-layer structure and the second multi-layer structure, and electrically connected to the second semiconductor device;
  wherein the metal shielding layer includes a metal layer for reducing light passing from the first semiconductor device to the second semiconductor device.

2. The integrated circuit of claim 1, wherein the metal shielding layer is electrically connected to the second substrate or an input/output (I/O) port of the integrated circuit.

3. The integrated circuit of claim 1, wherein the second multi-layer structure comprises a first metal film, and wherein the integrated circuit further comprises:
  a first conductive via, having a first end electrically connected to the metal shielding layer and a second end electrically connected to the first metal film.

4. The integrated circuit of claim 3, wherein the first metal film is a top metal portion of the second semiconductor device, and the first conductive via is disposed in a dielectric layer between the top metal portion and the metal shielding layer.

5. The integrated circuit of claim 3, wherein the first conductive via is disposed in a first layer adjacent to the metal shielding layer, and the first metal film is disposed in a second layer adjacent to the first layer.

6. The integrated circuit of claim 3, wherein the first metal film is configured to electrically connect the second substrate or an input/output port of the integrated circuit.

7. The integrated circuit of claim 3, wherein the second multi-layer structure further comprises:
  at least one second conductive via; and
  at least one second metal film;
  wherein the at least one second conductive via and the at least one second metal film are configured to electrically connect the first metal film to the second substrate or an input/output port of the integrated circuit.

8. The integrated circuit of claim 1 further comprising:
  an oxide layer, disposed between the first multi-layer structure and the metal shielding layer.

9. The integrated circuit of claim 1 further comprising:
  a through oxide via (TOV), electrically connecting the first semiconductor device and the second semiconductor device;
  wherein the through oxide via is electrically disconnected from the metal shielding layer.

10. A method of fabricating an integrated circuit, the method comprising:
  forming a first substrate;
  forming a first multi-layer structure over the first substrate to form a first semiconductor device;
  forming a second substrate;
  forming a second multi-layer structure over the second substrate to form a second semiconductor device;

forming a metal shielding layer between the first multi-layer structure and the second multi-layer structure; and electrically connecting the metal shielding layer to the second semiconductor device;

wherein the metal shielding layer is a metal layer for reducing light passing from the first semiconductor device to the second semiconductor device.

11. The method of claim 10, wherein forming the second multi-layer structure over the second substrate comprises forming a first metal film, and electrically connecting the metal shielding layer to the second semiconductor device comprises:

forming a first conductive via having a first end electrically connected to the metal shielding layer and a second end electrically connected to the first metal film.

12. The method of claim 11, wherein the first metal film is a top metal portion of the second semiconductor device, and the first conductive via is disposed in a dielectric layer between the top metal portion and the metal shielding layer.

13. The method of claim 11, wherein forming the second multi-layer structure over the second substrate further comprises:

forming at least one second conductive via; and forming at least one second metal film;

wherein the at least one second conductive via and the at least one second metal film are configured to electrically connect the first metal film to the second substrate or an input/output port of the integrated circuit.

14. The method of claim 10 further comprising:

forming an oxide layer between the first multi-layer structure and the metal shielding layer.

15. The method of claim 10 further comprising:

forming a through oxide via electrically connecting the first semiconductor device and the second semiconductor device;

wherein the through oxide via is electrically disconnected from the metal shielding layer.

16. A light sensing device, comprising:

a first semiconductor device, comprising a first substrate and a first multi-layer structure, the first substrate supporting the first multi-layer structure, and the first semiconductor device for converting an inputting light into an electronic signal;

a second semiconductor device, comprising a second substrate and a second multi-layer structure, the second substrate supporting the second multi-layer structure, and the second semiconductor device for receiving the electronic signal; and a metal shielding layer, disposed between the first multi-layer structure and the second multi-layer structure, and electrically connected to the second semiconductor device.

17. The light sensing device of claim 16, wherein the second multi-layer structure comprises a first metal film, and wherein the light sensing device further comprises:

a first conductive via, having a first end electrically connected to the metal shielding layer and a second end electrically connected to the first metal film.

18. The light sensing device of claim 16 further comprising:

an oxide layer, disposed between the first multi-layer structure and the metal shielding layer.

* * * * *